United States Patent
Bonthron et al.

(10) Patent No.: US 12,111,350 B2
(45) Date of Patent: Oct. 8, 2024

(54) METHOD AND APPARATUS FOR RF BUILT-IN TEST SYSTEM FOR A BEAMFORMING MODULE IN A RADAR SYSTEM

(71) Applicant: Metawave Corporation, Carlsbad, CA (US)

(72) Inventors: Andrew John Bonthron, Los Angeles, CA (US); Wei-Min Kuo, Redondo Beach, CA (US); Viktor Yevgenyevich Novozhilov, San Pedro, CA (US); Phuoc Thanh Nguyen, Garden Grove, CA (US); Michael Terry Nilsson, Carlsbad, CA (US)

(*) Notice: Subject to any disclaimer, the term of this patent is extended or adjusted under 35 U.S.C. 154(b) by 0 days.

(21) Appl. No.: 17/738,812

(22) Filed: May 6, 2022

(65) Prior Publication Data
US 2022/0365133 A1 Nov. 17, 2022

Related U.S. Application Data

(60) Provisional application No. 63/185,306, filed on May 6, 2021.

(51) Int. Cl.
G01R 31/28 (2006.01)

(52) U.S. Cl.
CPC ..... *G01R 31/2896* (2013.01); *G01R 31/2865* (2013.01); *G01R 31/2868* (2013.01); *G01R 31/2882* (2013.01)

(58) Field of Classification Search
CPC ...... H01Q 1/2283; H01Q 21/24; H01Q 1/243; H01Q 3/267; H01Q 3/2605; H01Q 21/28; G01S 13/931; G01S 2013/93271; G01S 5/0072; G01S 7/006; G01S 7/2813; G01S 13/426; G01S 13/34; G01S 2013/0245; G01S 7/4004; G01S 7/4069; G01S 13/867; G01S 7/352; G01S 7/02; G01S 7/4008; G01S 7/4021; G01S 13/536; G01S 7/036; H03H 11/16; H01P 1/10; G01R 29/0892; G01R 29/10; G01R 31/2822; G01R 31/2841; G01R 31/2856; G01R 31/2865; G01R 31/2868; G01R 31/2882; G01R 31/2896
See application file for complete search history.

(56) References Cited

U.S. PATENT DOCUMENTS

| | | | | |
|---|---|---|---|---|
| 8,711,981 | B2* | 4/2014 | Dehlink | G01R 31/2822 375/316 |
| 9,041,421 | B2* | 5/2015 | Peng | G01R 31/2822 324/750.01 |
| 9,692,530 | B2* | 6/2017 | O'Keeffe | H04B 17/14 |
| 10,289,530 | B2* | 5/2019 | Conti | G06F 11/3688 |
| 10,790,915 | B2* | 9/2020 | DaSilva | G01R 1/0408 |

(Continued)

FOREIGN PATENT DOCUMENTS

JP 2021032658 * 3/2021

*Primary Examiner* — Vinh P Nguyen
(74) *Attorney, Agent, or Firm* — Dinsmore & Shohl LLP

(57) ABSTRACT

An on-chip or built-in self-test (BIST) module for an RFIC is provided. The BIST module can be implemented in an RFIC system, which may include a beamforming module of a radar system. The BIST module may include components and methods to up-convert a signal from a test frequency to RF at an input to the RFIC and down-convert and output signal.

9 Claims, 6 Drawing Sheets

(56) References Cited

U.S. PATENT DOCUMENTS

| | | | |
|---|---|---|---|
| 11,187,737 B2* | 11/2021 | Nähring | H04B 17/21 |
| 11,525,888 B2* | 12/2022 | Kohtani | H04L 27/364 |
| 2021/0208246 A1* | 7/2021 | Kohtani | H01Q 1/3233 |
| 2022/0107408 A1* | 4/2022 | Kohtani | G01S 13/931 |

\* cited by examiner

METHOD AND APPARATUS FOR RF BUILT-IN TEST SYSTEM FOR A BEAMFORMING MODULE IN A RADAR SYSTEM

CROSS REFERENCE—CLAIM OF PRIORITY

This application claims priority from U.S. Provisional Application No. 63/185,306, titled "METHOD AND APPARATUS FOR RF BUILT-IN TEST SYSTEM," filed on May 6, 2021, and incorporated herein by reference in its entirety.

BACKGROUND

As electronics and integrated circuits move to higher frequencies, such as of millimeter waves, testing devices become more complex. The role of testing is to identify faults, diagnose and correct so that a device meets performance characteristics. Smart testing processes enable technology to operate properly over the life its application and to manufacture quality devices at higher yields. For millimeter wave applications, such as autonomous driving with sensors operational at 76 GHz to 78 GHz, have challenges in testing and failures of these devices have unacceptable conditions.

BRIEF DESCRIPTION OF THE DRAWINGS

The present application may be more fully appreciated in connection with the following detailed description taken in conjunction with the accompanying drawings, which are not drawn to scale and in which like reference characters refer to like parts throughout, and wherein.

DETAILED DESCRIPTION

Figure 1:
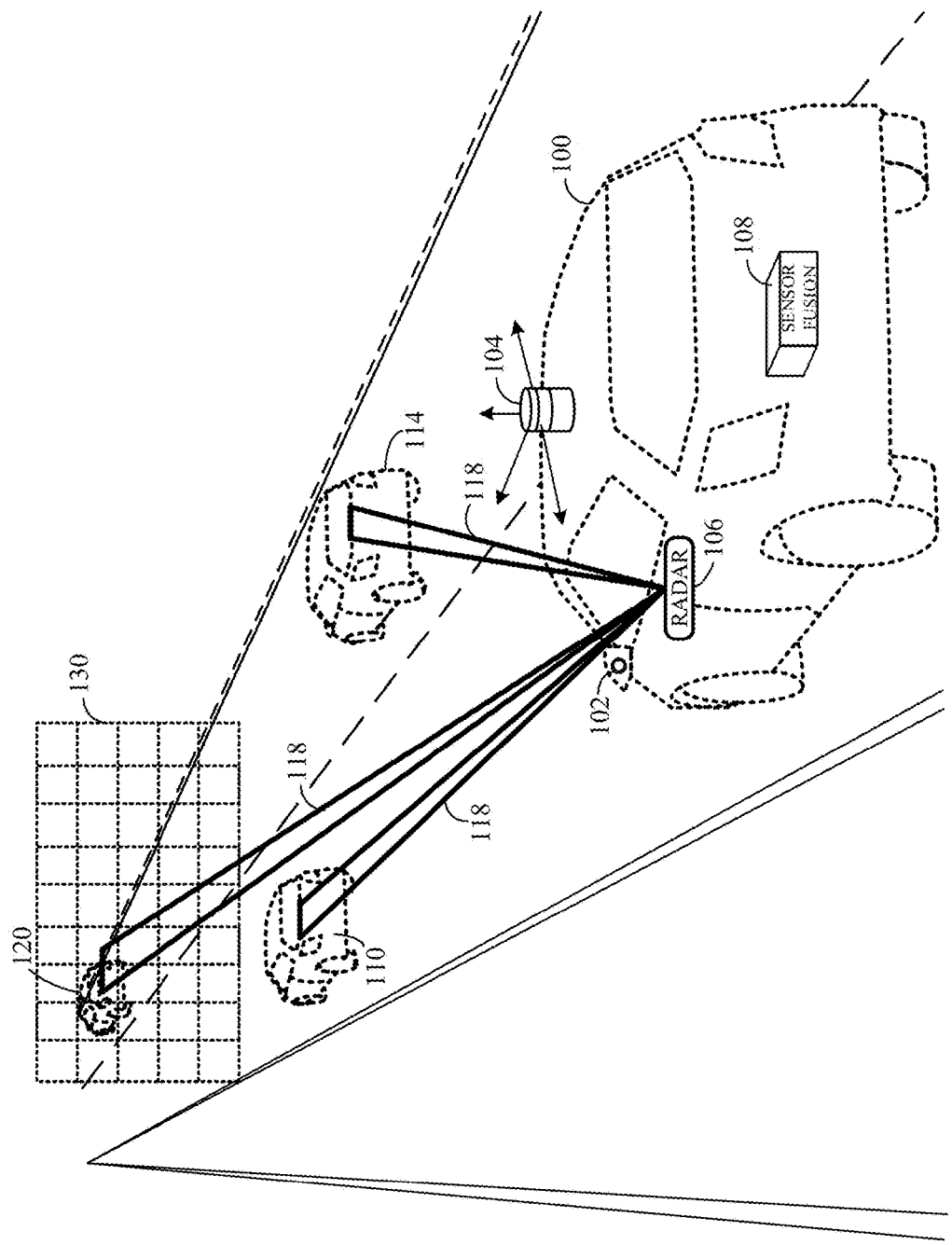
FIG. 1 illustrates a vehicle having various sensor systems, according to various embodiments of the present invention.

It is appreciated that, in the following description, numerous specific details are set forth to provide a thorough understanding of the examples. However, it is appreciated that the examples may be practiced without limitation to these specific details. In other instances, well-known methods and structures may not be described in detail to avoid unnecessarily obscuring the description of the examples. Also, the examples may be used in combination with each other.

The present invention provides an on-chip, or in-situ, test and calibration module enabling these processes during operation of a device and for the life of the device. As an example, the present invention is described in the context of a radar system having a phased array antenna. A phased array antenna is a collection of antenna elements assembled to generate a radiation pattern by constructive combinations. A phased array forms a main lobe radiating energy in the desired direction and location. Destructive interference, such as from side lobes, nulls and directional electromagnetic signals. Phased antenna arrays are designed to maximize the energy radiated in the main lobe while reducing the energy radiated in the side lobes to an acceptable level. The direction of radiation can be manipulated by changing the phase of the signal fed into each antenna element. For automotive and other real time applications, the antenna array is tasked with fast steering of the beam. Semiconductor IC-based phase adjustments are to be made in nanoseconds to change the direction of the radiation pattern in response to targets for user reaction. Testing may be performed at various levels, including at wafer, chip, and device. In addition, there are on-chip test methods and as a last resort failure analysis methods. As vehicles and components on vehicles shake and move during operation, including the sensor modules, these systems may require in situ module(s) for testing and correction capabilities.

The present invention discloses methods and apparatuses for calibration and test for radio frequency (RF) systems, such as a radar system. The methods and apparatuses are part of a built-in system test (BIST). The following block diagrams illustrate methods and implementations for the test and calibration of an RF beamforming IC.

Testing circuits for phased array antennas are typically done external to the system or IC module. Testing may use a lower frequency for local oscillator (LO) and intermediate frequency (IF) signals into or out of an integrated circuit (IC) enables faster testing using standard automated data acquisition test equipment that is operational at low frequency and is optimized for fast, low-cost IC testing. In contrast, radio frequency (RF) test equipment typically has a low signal-to-noise ratio (SNR), requiring longer integration time, and slow switching speed of internal RF components. The present inventions present methods and apparatuses to incorporate a self-test capability into the IC-based device avoiding problems of the prior art systems.

The present invention enables on-chip testing, calibration, general IC health check, and fault detection during IC operation. This goes beyond initial production testing, providing operational solutions over the life of the module or IC. In the illustrated embodiments and examples, an on-chip BIST module or circuitry generates and uses the RF input and output for test by application of low frequency IF output signals which enable low-cost testing and calibration of the beamformer IC. In addition, external, off-chip, interconnects may cause wide variations in signal loss and phase errors across the beamformer IC ports at high frequencies. Vehicular radar operates at millimeter wave frequencies, such as 77 GHz, making such methods ineffective.

The present invention applies precision on-chip interconnects, where amplitude error and phase error caused by the BIST circuitry are accurately identified and controlled. These methods and apparatuses eliminate the need for expensive external RF test equipment. The present inventions provide on-chip circuitry having precise and repeatable gain and phase. Some embodiments apply precision lithography for transmission lines and signal couplers having a high uniformity of circuit matching within the localized area of an IC. Presented herein are various methods, apparatus and implementations for the test and calibration of an RF beamforming IC.

Embodiments for test and calibration modules for an RF IC and specifically for a beamforming system apply to sensor modules operational over a variety of frequency ranges. The use of lower frequency signals for testing the IC enables faster testing using low frequency standard automated data acquisition test equipment that is optimized for fast, low cost, testing of ICs. RF test equipment is typically slow in measuring signals, due to low SNR (requiring longer integration time) and slow switching speed of internal RF components.

The present invention avoids the limitations of prior art testing systems, providing on-chip testing, calibration, general IC health check, and fault detection while the IC is operational and complements initial production testing, but is available over the life of the IC.

The precision on-chip interconnects, where amplitude error and phase error caused by the BIST circuitry can be accurately known and controlled. External (off-chip) interconnects can cause wide a variation of signal loss and phase errors across the beamformer IC ports at high frequencies, whereas on-chip circuitry has precise and repeatable gain and phase due to using precision lithography for the transmission lines and signal couplers, as well as high uniformity of circuit matching within the localized area of an IC.

FIG. 1 illustrates a radar system vehicle 100 having multiple sensors, including radar module 106, camera 102, lidar 104 and other sensors which receive data from the environment and provide same to sensor fusion 108. In the present invention, radar module 106 is a phased array module wherein a phase control module adjusts the phase of elements of the array to radiate a signal from a transmitter and similarly, the receive elements have a phase control module to adjust the phase of elements on the receiver.

The radar module 106 scans a field of view (FoV) around the vehicle, such as illustrated by FoV 130. The radar module 106 detects objects between the vehicle 100 and the extent of the FoV 130.

Figure 2:
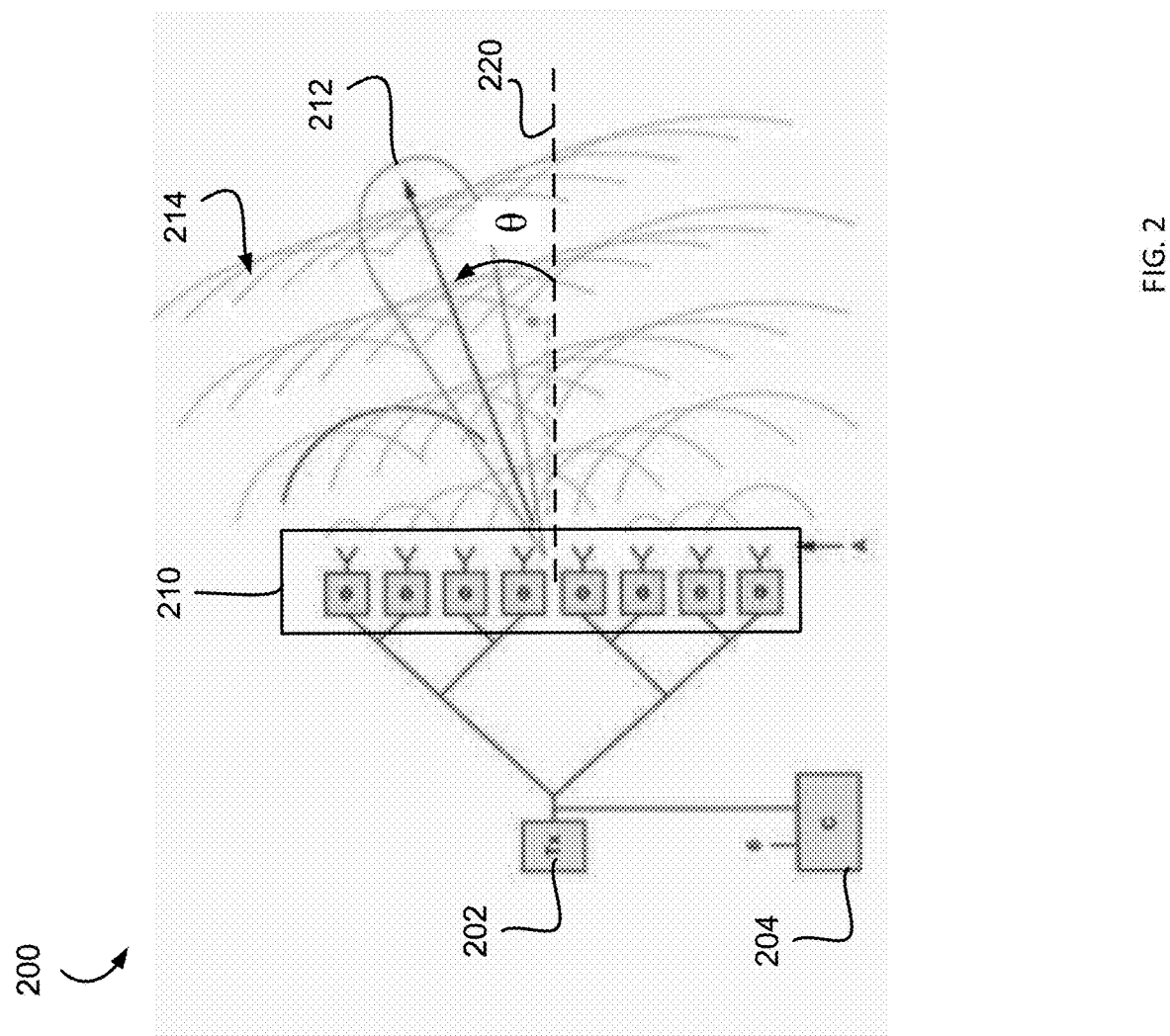
FIG. 2 illustrates a linear phased array antenna illustrating beam forming and is tested by examples of the present invention.

System 100 illustrated in FIG. 1 is a phased array antenna system 200 as in FIG. 2, wherein the system 200 has multiple antenna elements within array 210. The elements 210 each transmit a radiation beam at a given angle, such as radiation energies 214. The direction and amplitude of the radiation pattern 214 is determined by controlling the phase of the signal received from transceiver 202. When combined together the transmissions form a combined signal 212 having main lobe as illustrated. The angle of each element within array 210 is measured with respect to a line perpendicular to the array, referred to as boresight. The phase control of each element or set of elements is controlled to achieve the desired combined signal 212. The combined transmit signals form a directed beam 212 having an angle θ measured from boresight 220 to the directed beam, 212 formed by the combination of constituent radiation beams 214 illustrate the way a phased array antenna works. There are a variety of methods for analog and digital control of the antenna elements 210. In this example, a phase control circuit is implemented between the transmitter 202 and the antenna elements of array 210, wherein the phase control circuit provides analog phase control of the signal transmitted from each element. By controlling the phase, the beam 212 is steered or swept across the FoV. In some embodiments the beam is a fan beam in the azimuth which is steered in elevation to provide multi-dimensional object detection.

FIG. 2 illustrates a linear array of radiating elements 210 and each individual radiation pattern is identified as radiations 214, although alternate embodiments may control multiple elements to form subarrays and thus multiple beams. The elements 210 each transmit a radiation beam at a given angle, such as radiation energies 214. When combined together the transmissions form a combined signal 212 having main lobe as illustrated. The angle of each element 210 is measured with respect to a line perpendicular to the array, referred to as boresight. There are a variety of methods for analog and digital control of the antenna elements 210.

Figure 3:
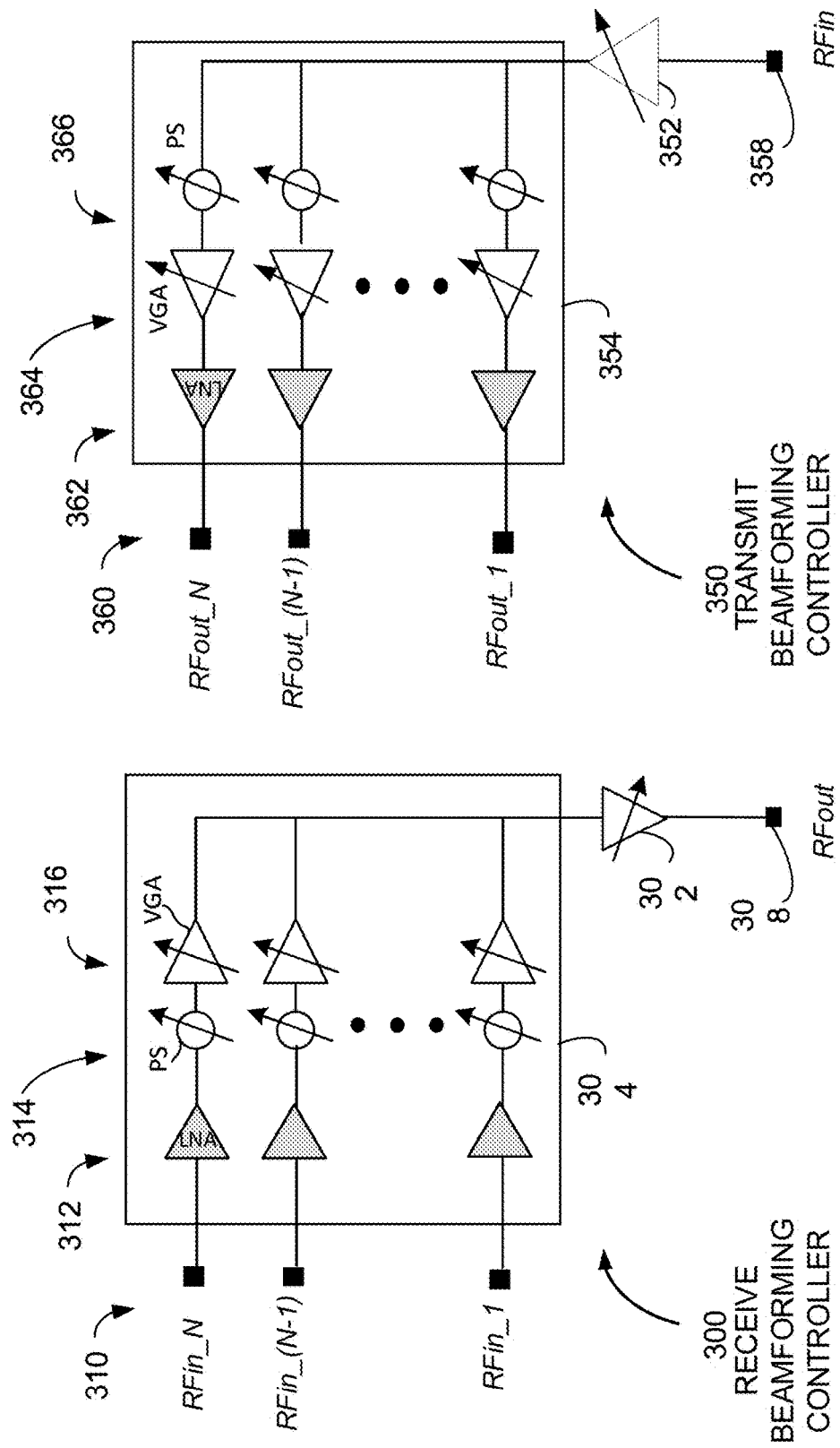
FIG. 3 illustrates receive and transmit portions of a phase control module of a beam steering phased array antenna, in accordance with various examples of the present invention.

FIG. 3 illustrates a detailed beamforming control system 300 to control a phased array system as system 200 of FIG. 2. The beamforming control circuit 300 includes beamforming module 304 that operates to control a phased array antenna in a radar application. The beamforming control system 300 receives input signals at N ports identified as input ports 310, labeled RFin_1 to RFin_N. The beamforming control circuit 300 beamforms and steers the beam from an antenna array (not shown) having N radiating elements, such as for receiving radar echo signals. The control module 304 includes transmission paths having low noise amplifier (LNA) 312, phase shifter (PS) 314, and variable gain amplifiers (VGA) 316. The signals are combined at summation node 308 to form RF_out. The beamforming circuit 300 is presented as the subject of the test and calibration apparatuses and methods described herein.

The RX beamformer control circuit 300 illustrated in FIG. 3 includes multiple paths for processing incoming signals at the receiver. The input RFin port 310 is coupled to LNA 312 to LNA then phase shifter (PS) 314 and variable gain amplifier (VGA) 316 for each front-end channel. The output of that beamformer front-end channel (RFin_1) then sums with the output of the other front-end channels (RFin_2, . . . , RFin_N) to a common RF output port (RFout) 308. As illustrated, an optional VGA 302 may be included on the common output line as shown in our RX beamformer example in FIG. 3.

FIG. 3 also illustrates a TX beamformer having an input RFin port 358 coupled to a VGA 352. The common input splits and is fed to each TX beamformer channel circuit having a PS 366, VGA 364 and power amplifier (PA) 362. The output of each PA 362 is an RFout port 360 corresponding to each path or channel 1, 2, . . . , N.

Figures 4, 5:
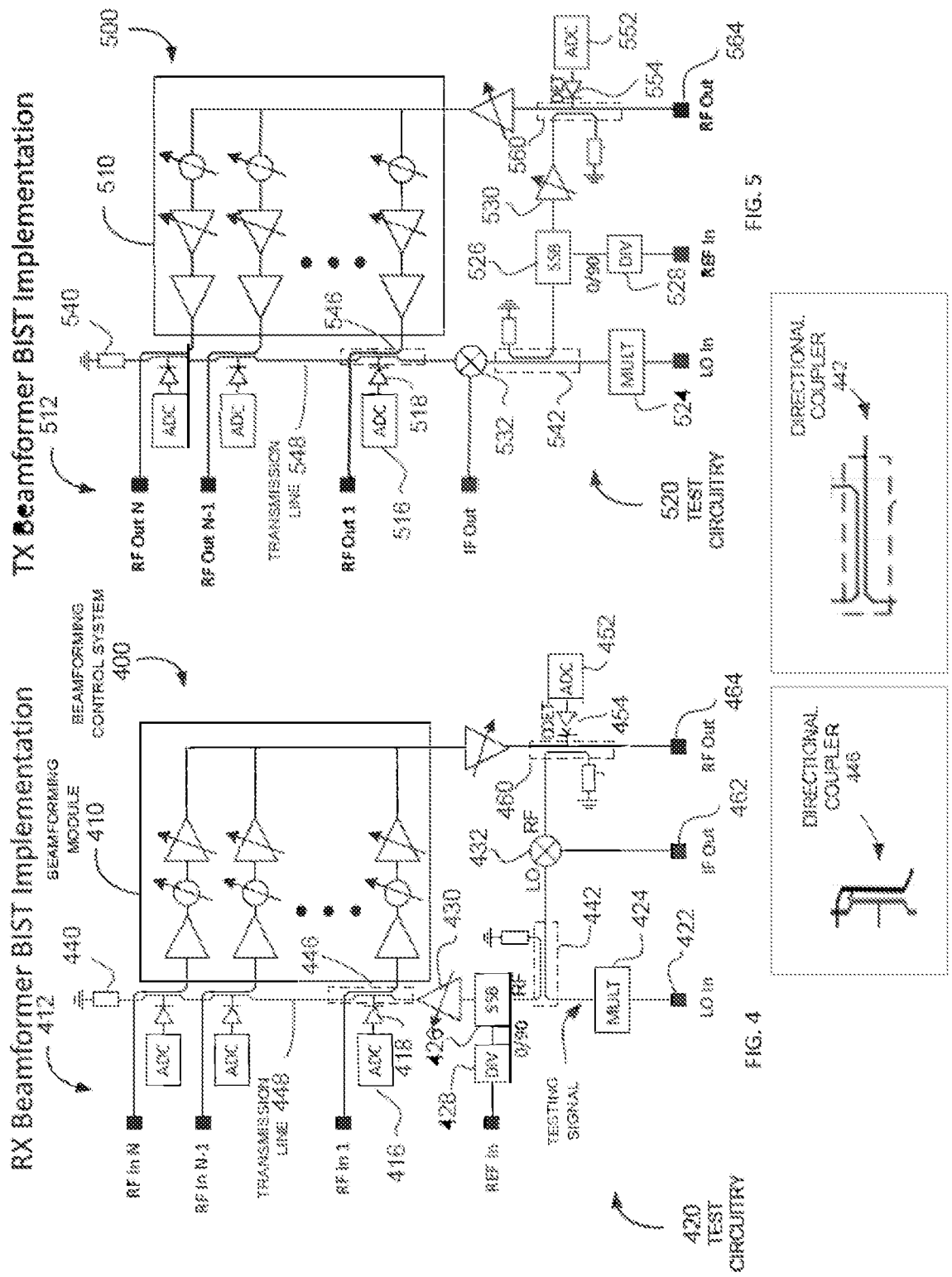
FIG. 4 illustrates a beam steering circuit of a receive antenna array with a built-in self-test (BIST) module, in accordance with various examples of the present invention.
FIG. 5 illustrates a beam steering circuit of a transmit antenna array with a BIST module, in accordance with various examples of the present invention.

FIG. 4 illustrates an example of the present invention for testing and calibration of a receive (RX) beamformer IC, such as beamforming control system 400 having a beamforming module 410. The operational circuitry of beamforming module 410 is as described with respect to module 304 in FIG. 3 and is designed to control a receive radar antenna in a radar system. The beamforming control system 400 is illustrated in black lines and represents the beamformer IC functionality for radar operation. The test circuitry 420, or BIST module, is used for in situ test, calibration and circuit health checks. In some embodiments, there are multiple circuits provided in addition to those illustrated to perform a variety of tests on the beamforming control system 400. The BIST module (test circuitry) 420 is positioned proximate to and integrated with the beamforming module 410 and these are built as a single unit or IC. The beamforming module 410 includes both the functional module components and the test components 420.

An external local oscillator (LO) signal is input at LO_in port 422 to an on-chip frequency multiplier block (MULT) 424 to generate an on-chip RF carrier signal for IC testing purposes, referred to herein as the testing signal. Providing a lower frequency input at the LO_in port 422 allows RF testing at lower frequencies, replacing a high frequency test signal and eliminating the requisite support therefor, such as high frequency signaling into and out of the beamforming control system 400. The testing signal drives one input of a mixer 432 (at an LO port) while a coupled portion of the testing signal is input to single-sideband modulator (SSB) 426 (at an RF port). An external reference signal, such as a typical 10 MHz or 40 MHz system clock, is input to a frequency divider block (DIV) 428, which generates a 50% duty cycle quadrature modulation signal that drives the modulation port of the SSB 426. In alternate examples, the SSB 426 can be realized by using a 90-degree phase splitter on the RF port connected to two mixers whose output are summed together and the LO ports of the TWO mixers are driven by the quadrature modulation signals.

In the present implementation, the mixers are realized by balanced Gilbert cells each driven differentially to achieve RF carrier suppression. The output of the SSB 426 is an offset frequency tone offset from the testing signal (the RF carrier) by the modulation frequency. This modulation frequency may be in the range of 100 kHz to 20 MHz, for example, and the divider may be programmable to apply different divide ratios. Using this offset frequency tone from the carrier is detailed hereinbelow.

Continuing with beamforming module 410 of FIG. 4, the output of the SSB 426 is input to a variable gain amplifier (VGA) 430 which is used to provide a variable testing signal power input to the beamformer IC receive ports 412 and beamformer module 410. The output of the VGA 430 drives a travelling-wave multi-port directional coupler 442, which provides coupled portions of this signal to the input ports 412 of the beamformer module 410. The directional coupler acts to couple a designed amount of electromagnetic power from the traveling wave output of VGA 430 to each of the multiple input ports 412, enabling use of the signal, traveling wave, to be used in each input to the beamforming module 410. The directional couplers 446 couple power flowing in one direction. As illustrated in FIG. 4, directional couplers 446 are two coupled transmission lines positioned proximate each other to enable energy coupling. The directional couplers 446 provide taps for energy at the coupling points. The travelling-wave directional couplers 446 are positioned on a transmission line 448 with one end connected to the output of the VGA 430 and the other end connected to a termination resistor 440. Along this transmission line 448 are disposed directional coupler lines, such as coupler 446, which can be edge coupled lines or broadside coupled lines, forward or reverse coupled signal designs, with a reverse coupled signal design. At each tap point, an analog to digital converter (ADC) 416 and a detector 418 are positioned. The detector 418 receives a portion of the signal for testing.

In the present embodiment, the directional couplers 446 act to tap off a portion of the signal energy, such as approximately 1% of the signal energy, in the vicinity of each beamformer input ports 412 to provide the appropriate portion of signal energy to the input of the beamformer module 410. By tapping a small portion of the signal energy on transmission line 448, there is minimal degradation of the travelling signal energy. In some embodiments, RF detectors are positioned along the transmission line 448 at the directional coupler 446 tap points to provide a measure of the input signal power at the input of the directional coupler 446 which feeds the input of the RX beamformer module 410. The testing circuit 420 may be used to properly calibrate the input signal level to the beamformer input port 412 for testing purposes and provide a signal to control the gain level of the VGA 430 within beamformer module 410.

In some embodiments, the output of the beamformer control system 400 is positioned proximate an RF detector 454 which provides a measure of the output power for testing and to calculate the gain of each channel of the beamformer control system 400. An example testing method enables a single beamforming channel while all other beamforming channels are disabled. The enabled channel is then tested individually, and this is repeated to test all channels one at a time. A directional coupler 460 in the vicinity of the RF detector 454 provides a portion of the beamformer output signal to the RF port of a mixer 432, which mixes this signal with the unmodulated RF carrier signal to generate an output IF signal at port IF_out 462. The output IF signal contains a tone at the modulation frequency which can be used to extract the magnitude and phase information of the tested beamformer channel for testing and calibration purposes.

In a typical arrangement, the IF signal can be amplified and filtered prior to being digitized by an A/D converter in an external test system (not shown). In some embodiments, the IF signal frequency may be in the range of 100 kHz to 20 MHz in a typical arrangement.

The present inventions use directional couplers, such as couplers 446, 442, 460, as to provide directivity to the test signals. This arrangement enables a test system to reduce the amount of signal propagating from the beamforming control system 400 at RF_out 464. This reduction alleviates issues of poor external RF signal termination being reflected back which may be summed with the test signal causing degradation of the desired test signal. However, the directional couplers could be replaced with non-directional couplers by one versed in the state of the art without departing from the spirit of the present invention.

FIG. 5 illustrates a transmit beamforming control system 500, similar to controller 350 of FIG. 3, including a built in circuit for testing and calibration of a TX beamforming module 510 for normal operation in a radar system. The additional circuitry is added for the purpose of built-in self-test (BIST) and calibration. This arrangement is similar to the arrangement in FIG. 4 with the differences described in detail herein. For beamforming module 510, the output of the VGA 530 provides the single sideband modulated RF signal from SSB 526 to the input of a directional coupler 560, which provides a portion of this modulated RF signal to the input of the TX beamforming module 510. An RF detector 554 is located in the vicinity of the input of the TX beamforming module 510 to monitor the power of this modulated RF signal for test purposes. Directional couplers 546 located at the output ports 512 of the TX beamforming module 510 to couple a portion of the output signal to the travelling-wave directional coupler transmission line 548, which has an arrangement similar to the receive beamforming module 410 described in FIG. 4. The directional couplers 546 provide that the tapped signals traveling on the transmission line 58 in the direction of the mixer 532, as opposed to travelling in the direction of the termination 540, which is an advantage of using directional couplers in this arrangement. As with the arrangement in FIG. 4, the directional couplers could be replaced with non-directional coupling means without departing from the spirit of the present invention. One end of the travelling-wave transmission line is connected to a termination resistor 540, while the other end is connected to a mixer 532. The tapped portion of each TX beamforming module output signal is coupled to the travelling-wave transmission line 548 and propagate in the direction of the mixer 532, due to the directionality of the directional couplers 546. In some embodiments, a single channel of the TX beamforming module 510 is enabled and tested at a time, while the other channels are disabled, such that one coupled signal travels along the transmission line 548 to the mixer 532 at a time during test and calibration. This coupled signal is connected to the RF port of the mixer 532, where it is mixed with the unmodulated RF carrier signal to generate an IF signal, from which magnitude and phase information can be extracted from the tone at the modulation frequency, similarly to the methodology described in FIG. 4.

Figures 6, 7:
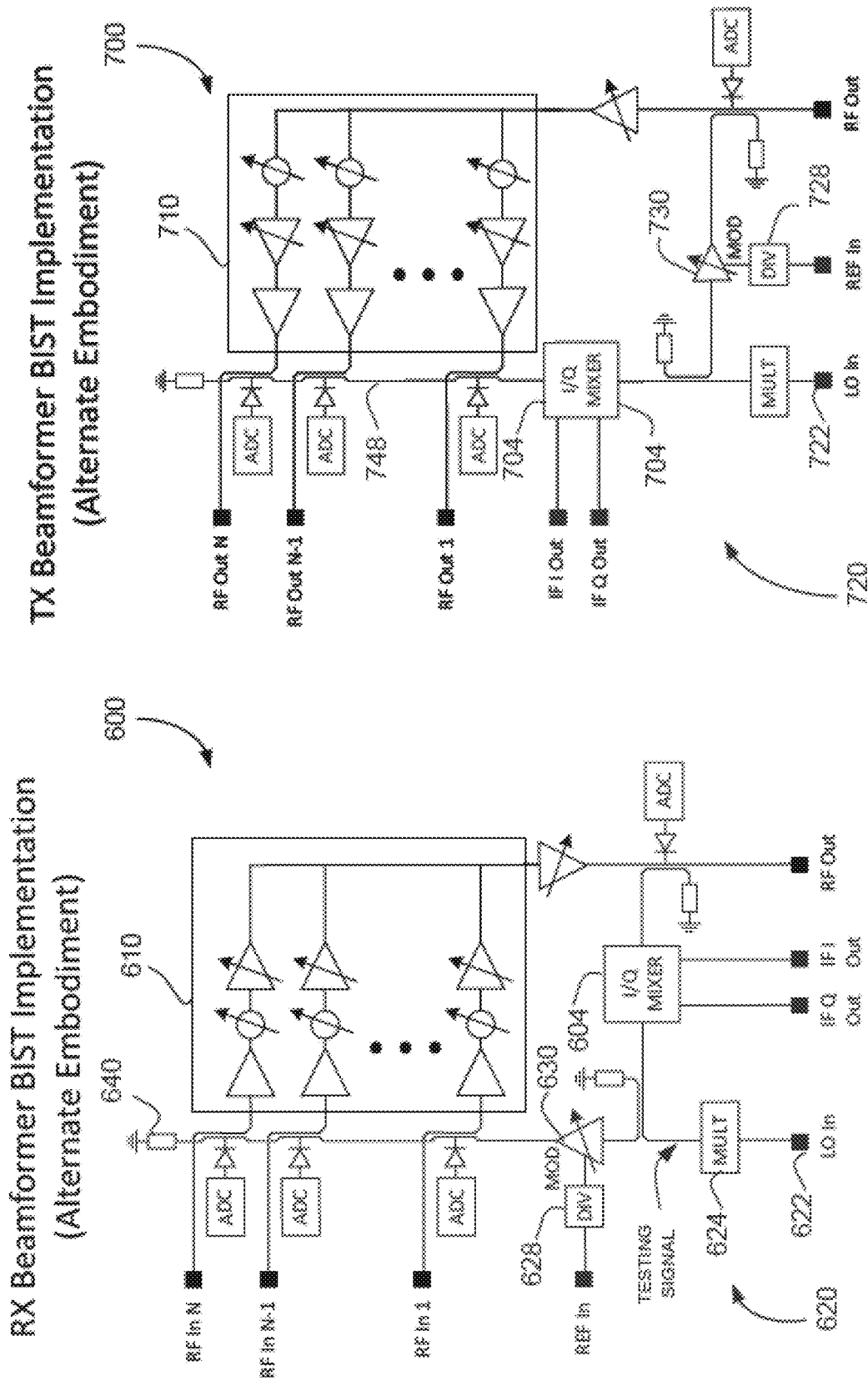
FIG. 6 illustrates a beam steering circuit of a receive antenna array with a BIST module, in accordance with various examples of the present invention.
FIG. 7 illustrates a beam steering circuit of a transmit antenna array with a BIST module, in accordance with various examples of the present invention.

FIG. 6 illustrates an alternate embodiment of the invention for the testing and calibration of an RX beamforming control system 600. This arrangement is similar to that shown in FIG. 4, with the following difference, the system 600 uses a double-sideband (DSB) modulation configuration in place of a SSB for modulating the RF carrier signal. In some arrangements of this embodiment, the double-sideband modulation is implemented using a Gilbert cell VGA modulated with a signal in the 100 kHz to 20 MHz range. The use of a Gilbert VGA results in carrier-suppressed bi-phase modulation which has the advantage of lower amplitude of the undesired RF carrier feed-though spectral tone. This modulated test signal is input the RX beamformer input channels in the same manner as that shown in FIG. 4. The output signal from the RX beamforming module 610 is coupled similarly to the arrangement in FIG. 4. In this arrangement, however, the signal is input to an image reject mixer 604, which provides in-phase (I) and quadrature (Q) IF outputs when mixed with the unmodulated RF carrier.

In some implementations, the image reject mixer 604 may be realized by using a 90-degree phase splitter on the RF input port connected to two mixers with the LO ports of the mixers driven by the unmodulated RF carrier signal. The output of one mixer is the in-phase IF signal and the output of the other mixer is the quadrature IF signal. In some implementations, the mixers are realized by balanced Gilbert cells each driven differentially such that RF carrier suppression is achieved. The magnitude and phase information can be extracted from the tones at the modulation frequency of the in-phase IF and quadrature IF signals using standard techniques known to those versed in the art.

FIG. 7 illustrates an alternate embodiment of the invention for the testing and calibration of a TX beamforming control system 700. This arrangement is similar to that shown in FIG. 5, with the following difference, the system 700 uses a DSS modulation configuration in place of a SSB for modulating the RF carrier signal. In some arrangements, the DSS modulation is implemented using a Gilbert cell VGA 730 which is modulated with a signal in the 100 kHz to 20 MHz range. The use of a Gilbert VGA 730 results in carrier-suppressed bi-phase modulation which has the advantage of lower amplitude of the undesired RF carrier feed-though spectral tone. This modulated test signal is input to the TX beamformer input channel in the same manner as that shown in FIG. 5. The output signal from the TX beamforming control system 700 channels is coupled similarly to the arrangement in FIG. 5. In this arrangement, however, the signal is input to an image reject mixer 704, which provides in-phase (I) and quadrature (Q) IF outputs when mixed with the unmodulated RF carrier.

In some implementations, the image reject mixer 704 may be realized by using a 90 degree phase splitter on the RF input port connected to two mixers with the LO ports of the mixers driven by the unmodulated RF carrier signal. The output of one mixer is the in-phase IF signal and the output of the other mixer is the quadrature IF signal. In some implementations, the mixers are realized by balanced Gilbert cells each driven differentially such that RF carrier suppression is achieved. The magnitude and phase information may be extracted from the tones at the modulation frequency of the in-phase IF and quadrature IF signals using standard techniques known to those versed in the art.

Additional variations in the arrangements shown can be done by someone versed in the art without departing from the spirit of the present inventions. One such variation is to implement an on-chip VCO and PLL circuit, locked to an external frequency reference, to replace the frequency multiplier in order to generate the RF carrier signal. Another variation would be to use two frequency multipliers with two different external LO inputs, where the LO input signals are offset in frequency from each other by a fixed frequency, for example in the range of 100 kHz to 20 MHz. In this variation, one of the outputs of the frequency multiplier would be input to the VGA and the output of the other frequency multiplier would go to the input of the mixer, eliminating the need for the single-sideband modulator in the arrangements in FIGS. 3, 4. The resulting frequency offset between the outputs of the frequency multipliers would represent the IF tone frequency which would contain the desired magnitude and phase information to be utilized for test and calibration purposes. Another variation would be to use two external RF signals where the RF input signals are offset in frequency from each other by a fixed frequency, for example in the range of 100 kHz to 20 MHz. In this variation, one of the RF input signals would be input to the VGA and other RF signal would go to the input of the mixer, eliminating the need for the single-sideband modulator in the arrangements in FIGS. 1 & 2. The resulting frequency offset between the outputs of the frequency multipliers would represent the IF tone frequency which would contain the desired magnitude and phase information to be utilized for test and calibration purposes.

Figure 8:
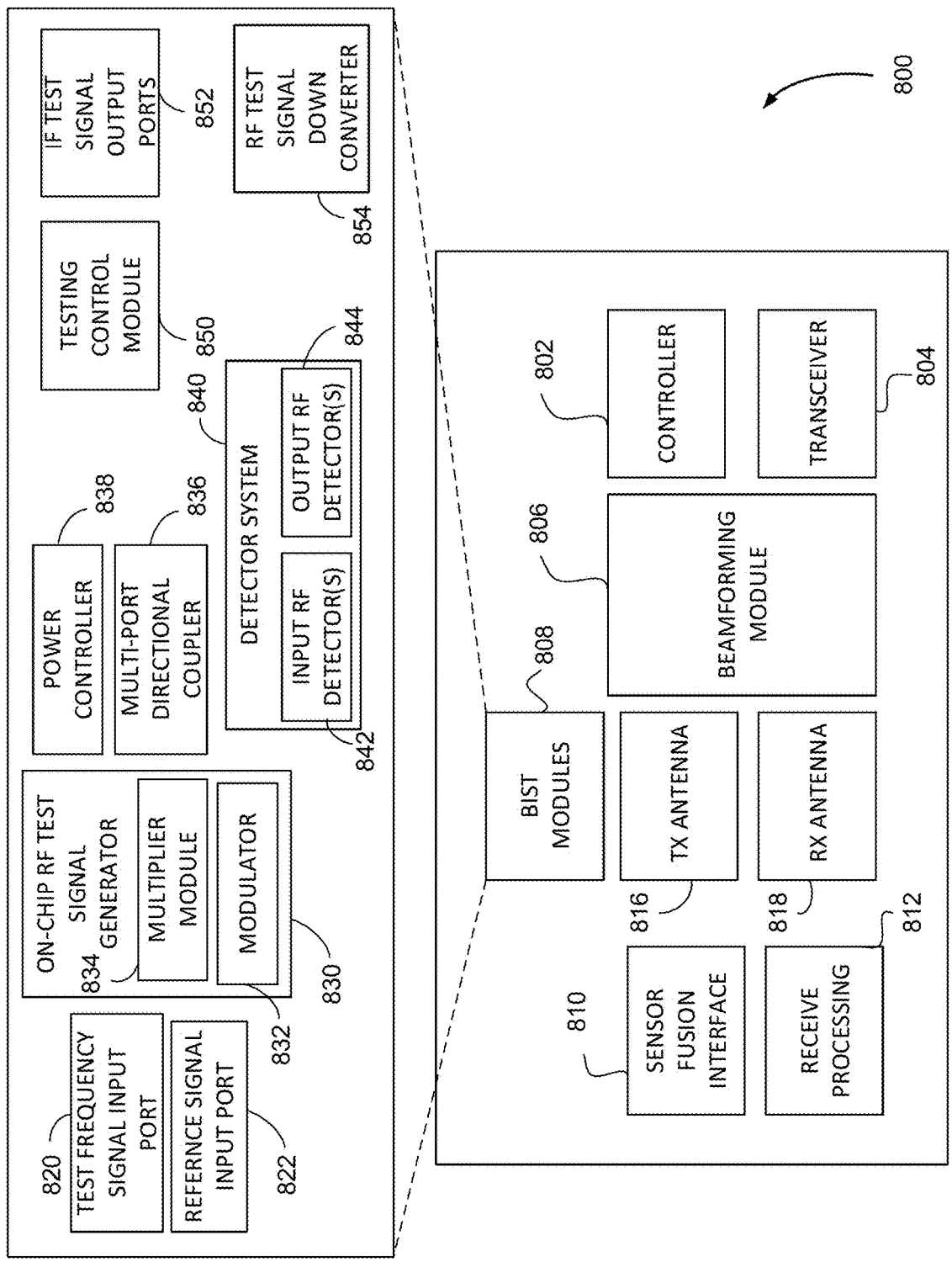
FIG. 8 illustrates a block diagram of a beamsteering radar module with BIST, in accordance with various examples.

FIG. 8 illustrates a block diagram of a portion of a radar system 800 incorporating the inventions presented herein. A beamforming module 806 is coupled to a controller 802, transceiver 804, and antennas 816, 818. The portion of radar system 800 includes a sensor fusion interface 810 and receive processing module 812, as well as BIST modules 808. The BIST modules 808 may be combined in a single module or may be separate modules for transmit and receive antennas 818, 816.

BIST modules 808 acts to test the high frequency circuitry of system 800 using lower frequency test equipment by providing on-chip test circuitry. The BIST modules 808 include a test frequency signal input port 820 to receive test signals at a test frequency and a reference signal input port 822 to provide a signal for modulation. An on-chip RF test signal generator 830 receives these signals and prepares for high frequency testing. The on-chip RF test signal generator 830 includes a multiplier module 834 and a modulator 832 having functions as described herein. A power controller 838 may be a VGA or other controller to assist in test operations. A multi-port directional coupler 836 provides coupling to RF inputs to the system 800 to tap a portion of the input signal for testing each channel. A testing control module 850 implements a test method for the system 800, and specifically for beamforming module 806. A detector system 840 includes a set of input RF detector(s) 842 and output RF detector(s) 844 to measure input signals and output signals. An RF test signal down converter 854 prepares the output signal to a test frequency. An IF test signal output port then provides the down converted test signals to an external test equipment. There are a variety of implementations contemplated, some of which are described herein.

It is appreciated that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

What is claimed is:

1. A method for testing an integrated circuit (IC), comprising:
   receiving, at an on-chip frequency multiplier block (MULT), a test signal at an input test frequency;
   converting, via a single-sideband modulator (SSB), the test signal to a radio frequency (RF) test signal at an operational frequency for the IC, wherein the operational frequency is higher than the input test frequency;
   providing, via a directional coupler, the RF test signal to at least one input of the IC;
   detecting, via a first detector coupled to a first analog to digital converter (ADC), an RF input signal at the at least one input;
   processing the RF input signal through the IC;
   detecting, via a second detector coupled to a second ADC, an RF output signal at a corresponding at least one output-of the IC; and
   down converting, via a signal down converter, the RF output signal to generate an output test signal at an output test frequency, wherein the output test frequency is lower than the operational frequency.

2. The method as in claim 1, wherein converting the test signal to the RF test signal comprises modulating the test signal using a modulation signal generated by a frequency divider block.

3. The method as in claim 1, wherein detecting the RF input signal comprises coupling the RF input signal with operational input signals to the IC.

4. The method as in claim 1, wherein the providing of the RF test signal, the detecting of the RF output signal, and the down converting of the detected RF output signals are performed for one input and one output at a time while a remainder of a plurality of inputs and outputs are disabled.

5. The method as in claim 1, wherein the IC is a beamforming module, and where the beamforming module is part of a radar system.

6. A built-in self-test (BIST) circuit for a radio frequency integrated circuit (RF IC), comprising:
   an on-chip RF test signal generator configured to convert a test signal having a frequency to a signal having a higher frequency than the frequency of the test signal;
   a multi-port directional coupler module, comprising:
      a transmission line coupled to the on-chip RF test signal generator; and
      a plurality of couplers distributed along the transmission line, each coupler of the plurality of couplers proximate at least one port of the RF IC and configured to couple the signal to the at least one port of the RF IC; and
      a detection system having a plurality of detectors positioned proximate the plurality
   of couplers.

7. The BIST circuit of claim 6, wherein the on-chip RF test signal generator comprises:
   a multiplier module configured to generate an RF signal from the signal; and
   a modulator configured to provide a modulation signal.

8. The BIST circuit of claim 7, wherein the modulator is a single sideband modulator.

9. The BIST circuit of claim 7, further comprising:
   a variable power control module coupled to the modulator to control a test signal power.

* * * * *